(12) United States Patent
Ye et al.

(10) Patent No.: US 9,305,749 B2
(45) Date of Patent: Apr. 5, 2016

(54) METHODS OF DIRECTING MAGNETIC FIELDS IN A PLASMA SOURCE, AND ASSOCIATED SYSTEMS

(71) Applicant: Applied Materials, Inc., Santa Clara, CA (US)

(72) Inventors: Zheng John Ye, Santa Clara, CA (US); Jay D. Pinson, II, San Jose, CA (US); Hiroji Hanawa, Sunnyvale, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/600,397

(22) Filed: Jan. 20, 2015

(65) Prior Publication Data

US 2015/0228456 A1    Aug. 13, 2015

Related U.S. Application Data

(60) Provisional application No. 61/937,947, filed on Feb. 10, 2014.

(51) Int. Cl.
*H05B 37/02* (2006.01)
*H01J 37/32* (2006.01)

(52) U.S. Cl.
CPC ....... *H01J 37/3211* (2013.01); *H01J 37/32458* (2013.01); *H01J 37/32522* (2013.01); *H01J 37/32669* (2013.01)

(58) Field of Classification Search
CPC ....... H05H 1/14; H05H 1/16; H01J 37/32082; H01J 37/32091; H01J 37/321
See application file for complete search history.

(56) References Cited

U.S. PATENT DOCUMENTS

| 6,664,740 | B2* | 12/2003 | Rostoker et al. ......... 315/111.41 |
| 2002/0004309 | A1 | 1/2002 | Collins et al. |
| 2002/0108713 | A1 | 8/2002 | Hanawa et al. |
| 2003/0047449 | A1 | 3/2003 | Hanawa et al. |
| 2003/0234617 | A1* | 12/2003 | Monkhorst et al. ...... 315/111.41 |

(Continued)

FOREIGN PATENT DOCUMENTS

JP            2002-140997 A      5/2002

OTHER PUBLICATIONS

International Search Report and Written Opinion of PCT/US2015/012607 mailed on Apr. 30, 2015, 11 pages.

*Primary Examiner* — Douglas W Owens
*Assistant Examiner* — Monica C King
(74) *Attorney, Agent, or Firm* — Kilpatrick Townsend & Stockton LLP

(57) ABSTRACT

A plasma source includes a plasma vessel that includes a dielectric material that encloses a cavity of a toroidal shape. The toroidal shape defines a toroidal axis therethrough. The vessel forms input and output connections, each of the input and output connections being in fluid communication with the cavity. One or more metal plates are disposed adjacent to the plasma vessel for cooling the plasma vessel. A magnetic core is disposed along the toroidal axis such that respective first and second ends of the magnetic core extend beyond axially opposed sides of the plasma vessel. First and second induction coils are wound about the respective first and second ends of the magnetic core. A plasma is generated in the cavity when an input gas is supplied through the input connection and an oscillating electrical current is supplied to the first and second induction coils.

15 Claims, 7 Drawing Sheets

(56) References Cited

U.S. PATENT DOCUMENTS

| | | |
|---|---|---|
| 2007/0145023 A1 | 6/2007 | Holber et al. |
| 2008/0142729 A1 | 6/2008 | Chen |
| 2008/0185284 A1 | 8/2008 | Chen et al. |
| 2011/0068691 A1* | 3/2011 | Scherer et al. ........... 315/111.31 |
| 2011/0114601 A1 | 5/2011 | Lubomirsky et al. |
| 2011/0142185 A1 | 6/2011 | Woodruff |
| 2011/0234100 A1* | 9/2011 | Tomita et al. ............ 315/111.21 |
| 2012/0034137 A1 | 2/2012 | Risby |
| 2013/0105086 A1 | 5/2013 | Banna et al. |

* cited by examiner

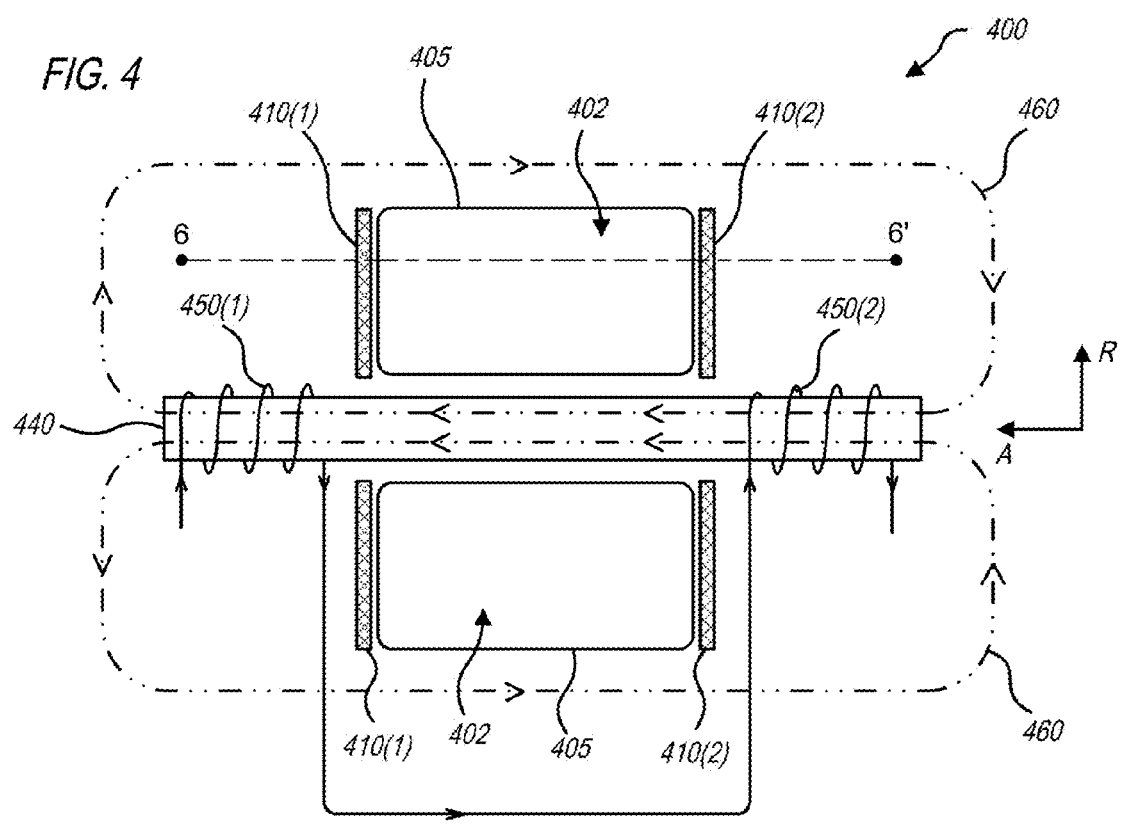
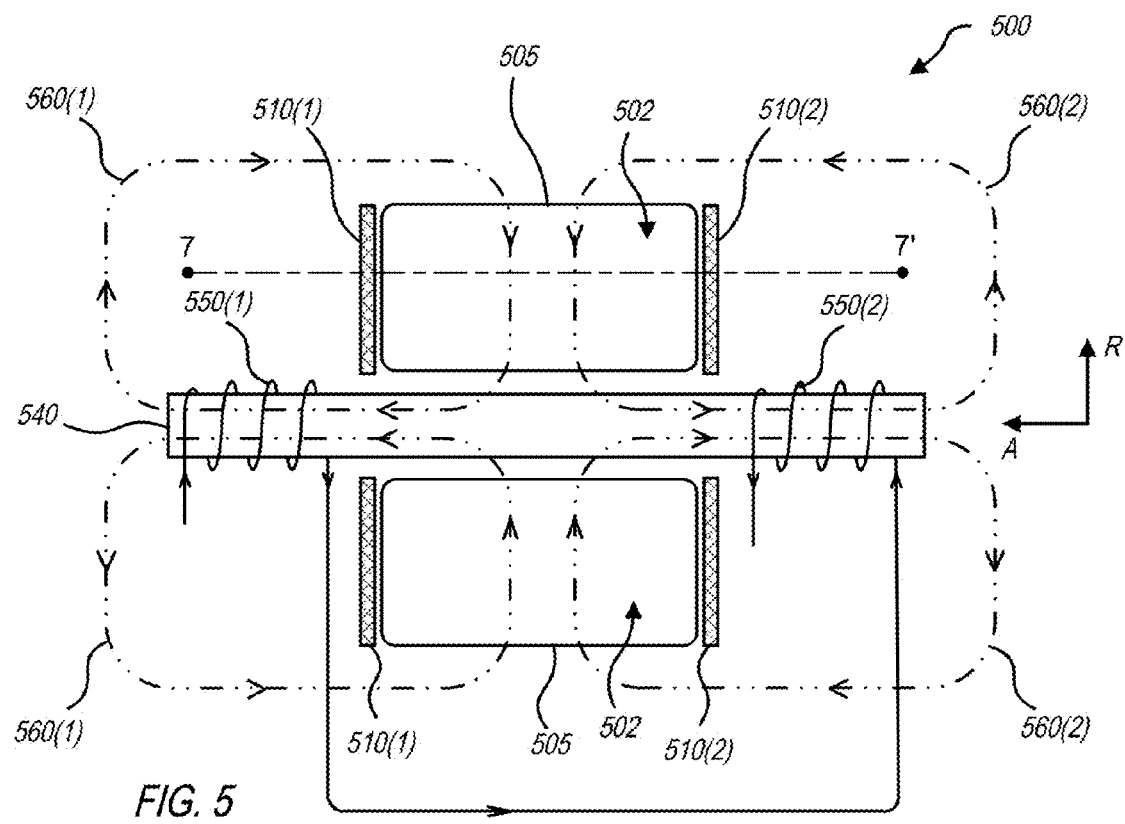

METHODS OF DIRECTING MAGNETIC FIELDS IN A PLASMA SOURCE, AND ASSOCIATED SYSTEMS

CROSS-REFERENCE TO RELATED APPLICATIONS

This application claims the benefit of U.S. Provisional Patent Application No. 61/937,947, filed Feb. 10, 2014, which is incorporated by reference herein.

TECHNICAL FIELD

The present disclosure is directed to technology for plasma generation, as may be used, for example, in semiconductor wafer processing. In particular, systems and methods of directing magnetic fields in a plasma source are disclosed.

BACKGROUND

Plasma processing is commonly used in processing of semiconductors and other products. Plasmas can be used for a variety of processing operations including deposition, etching, oxidation, removal of organic material, and other treatments. Generating a plasma involves exposing an input gas to energy input in the form of high electric and/or magnetic fields. At least some of the molecules of the input gas are excited by the fields and gain energy, in some cases becoming ionized.

Processing involves exposing the product to ions or reactive species generated in the plasma, and/or gas molecules that were present in the plasma but were not excited (any combination of plasma-generated ions, reactive species, and/or gas molecules that were not excited by the plasma will be referred to as "plasma products" herein). Generally speaking, there are two modes of plasma processing. In in-situ processing, item(s) being processed are in the location where the plasma is generated. In remote plasma processing, a plasma is generated in a first location, and the plasma products are brought to a second location, where they contact the item(s) being processed. Gas flows, vacuum pumping, electric fields and/or magnetic fields may be utilized to direct the plasma products to the product being processed. Remote treatment is sometimes preferable because parameters that affect the plasma can be controlled at the first location, but at the second location containing the product, the high electric or magnetic fields used to generate the plasma, and/or high velocity ions produced in the plasma, can be reduced or eliminated to avoid damage to certain types of product. Some plasma processing systems provide both in-situ and remote plasma processing capabilities.

Two known methods of generating a plasma are capacitive coupling and inductive coupling. In a capacitively coupled plasma, a high frequency (usually radio frequency, or RF) electric field is applied directly to the input gas to generate the plasma. In an inductively coupled plasma, a magnetic field is provided within a chamber containing the input gas. The magnetic field is often generated by a high power RF signal being transmitted into a coil, so that the magnetic field is generated within the coil, and generates transverse electrical currents within the gas according to the right-hand rule. Some capacitive coupling is often utilized to initiate the plasma by inducing a Townsend avalanche in the input gas, generating charge carriers for the transverse electrical currents. In some cases the coil is wrapped around the location where the plasma is generated; in others coil is wrapped around a magnetic (e.g., ferrite) core to enhance and/or direct the magnetic field to another location where the plasma is generated.

SUMMARY

In an embodiment, a plasma source is disclosed. The plasma source includes a plasma vessel that includes a dielectric material that encloses a cavity of a toroidal shape. The toroidal shape defines a toroidal axis therethrough. The vessel forms input and output connections, each of the input and output connections being in fluid communication with the cavity. One or more metal plates are disposed adjacent to the plasma vessel for cooling the plasma vessel. A magnetic core is disposed along the toroidal axis such that respective first and second ends of the magnetic core extend beyond axially opposed sides of the plasma vessel. First and second induction coils are wound about the respective first and second ends of the magnetic core. A plasma is generated in the cavity when an input gas is supplied through the input connection and an oscillating electrical current is supplied to the first and second induction coils.

In an embodiment, a method of generating a plasma includes supplying an input gas to an input connection of a plasma vessel. The plasma vessel includes a dielectric material that encloses a cavity of a toroidal shape. The toroidal shape defines a toroidal axis therethrough. A magnetic core is disposed along the toroidal axis. The input connection is in fluid communication with the cavity. The method further includes supplying an oscillating electrical current to first and second induction coils that are wound about the magnetic core, such that respective first and second ends of the magnetic core extend beyond axially opposed sides of the plasma vessel, and the oscillating electrical current ignites a plasma within the input gas. The method further includes cooling the plasma vessel by utilizing one or more metal plates disposed adjacent to the plasma vessel.

In an embodiment, a plasma source includes a plasma vessel including a dielectric material that encloses a cavity of a toroidal shape. The toroidal shape defines a toroidal axis therethrough. The vessel forms input and output connections, each of the input and output connections being in fluid communication with the cavity. Two metal plates are disposed adjacent to axially opposed sides of the plasma vessel such that the plasma vessel is between the metal plates. The two metal plates form channels therein for a cooling fluid, typically a liquid, for cooling the plasma vessel. A magnetic core, including a single piece of magnetic material with a channel therein for the cooling fluid, is disposed along the toroidal axis such that respective first and second ends of the magnetic core extend beyond axially opposed sides of the plasma vessel. First and second induction coils are wound about the respective first and second ends of the magnetic core in opposing directions, such that magnetic fields induced by the first and second induction coils in the magnetic core are in opposite directions along the toroidal axis. The plasma source further includes a Faraday shield having components that encircle the plasma vessel in an axial direction, the components being electrically connected with the two metal plates. A plasma is generated in the cavity when an input gas is supplied through the input connection and an oscillating electrical current is supplied to the first and second induction coils.

BRIEF DESCRIPTION OF THE DRAWINGS

FIG. 4 is a cross-sectional, schematic illustration of a magnetic configuration of a remote plasma source that may be understood according to the principles explored in FIGS. 3A-3D, according to an embodiment.

FIG. 5 is a cross-sectional, schematic illustration of a magnetic configuration of a remote plasma source that may be understood according to the principles explored in FIGS. 3A-3D, according to an embodiment.

DETAILED DESCRIPTION

Figure 1:
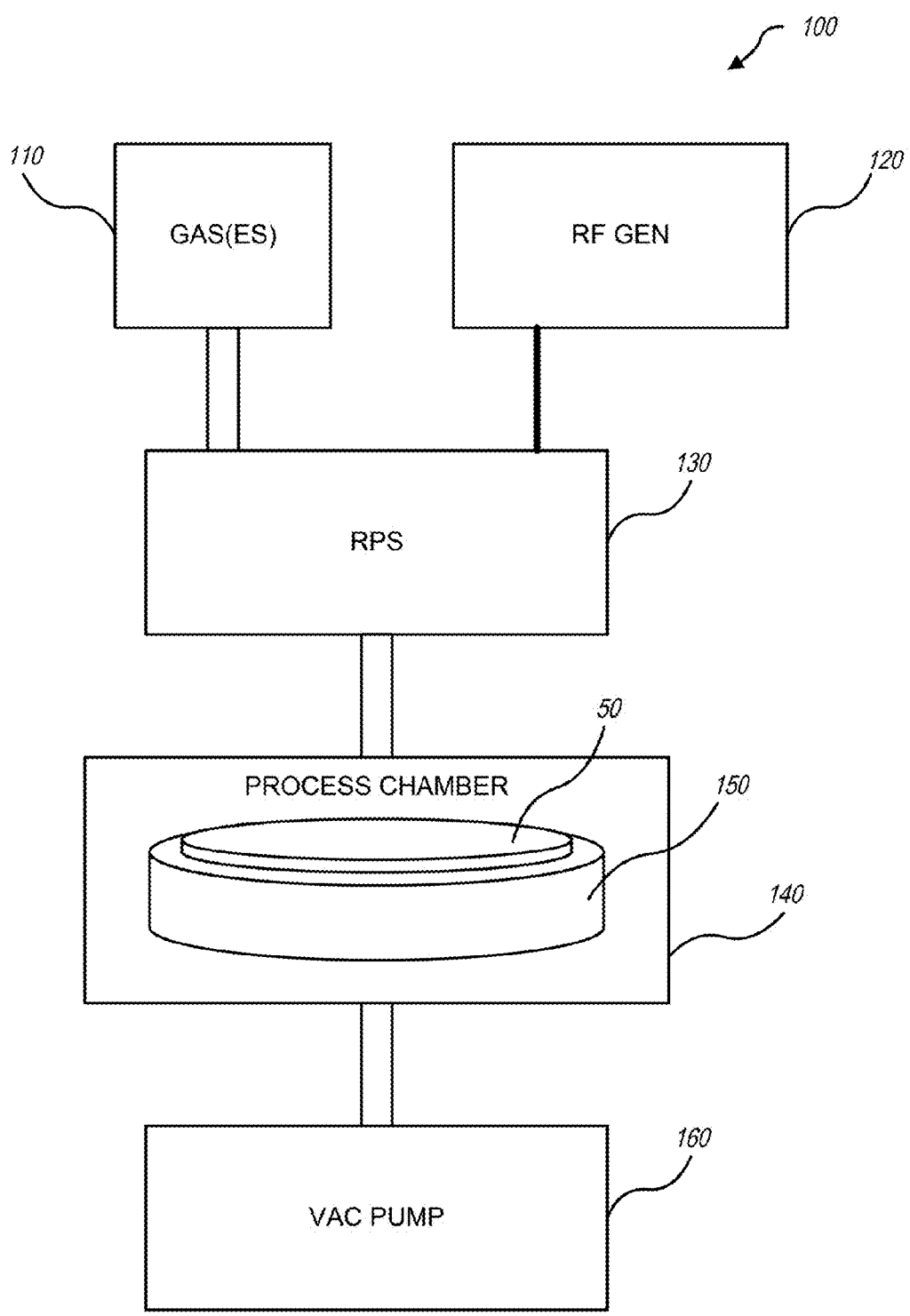
FIG. 1 schematically illustrates major elements of a plasma processing system, according to an embodiment.

The present disclosure may be understood by reference to the following detailed description taken in conjunction with the drawings briefly described below. It is noted that, for purposes of illustrative clarity, certain elements in the drawings may not be drawn to scale. Specific instances of an item may be referred to by use of a numeral in parentheses (e.g., induction coils 250(1), 250(2)) while numerals without parentheses refer to any such item (e.g., induction coils 250).

FIG. 1 schematically illustrates major elements of a plasma processing system 100, according to an embodiment. Plasma processing system 100 is a remote processing system that includes a remote plasma system (RPS) 130 that receives one or more source gases 110 and RF energy from an RF generator 120. Plasma and/or plasma products generated in RPS 130 are directed to a processing chamber 140. Plasma processing system 100 is illustrated as a semiconductor processing system that exposes a wafer 50, placed on or held by a fixture 150, to the plasma or plasma products. A vacuum pump 160 removes the plasma, plasma products, and/or other byproducts of processing from chamber 140. It is understood by those skilled in the art that plasma processing system 100 is a generalized system illustration. Other embodiments of a plasma processing system may include features not shown in FIG. 1. Such additional features may include but are not limited to sensors, control electronics, product handling systems, multiples of any of the components shown, different schemes for connecting gases and vacuum among the system components, in-situ plasma generation capability within chamber 140, and the like.

Figure 2A:
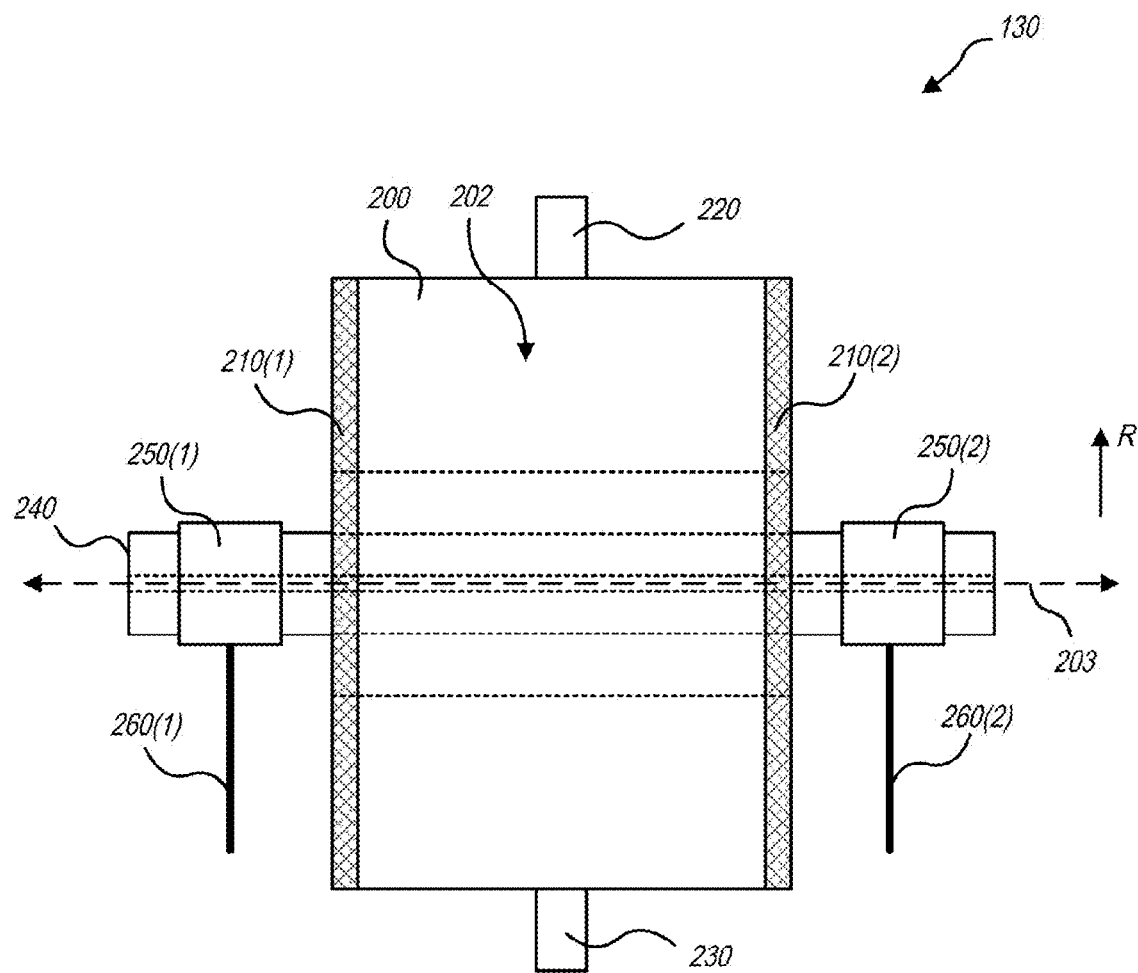
FIGS. 2A, 2B and 2C schematically illustrate components of a remote plasma source that forms part of the plasma processing system shown in FIG. 1, according to an embodiment.
Figure 2B:
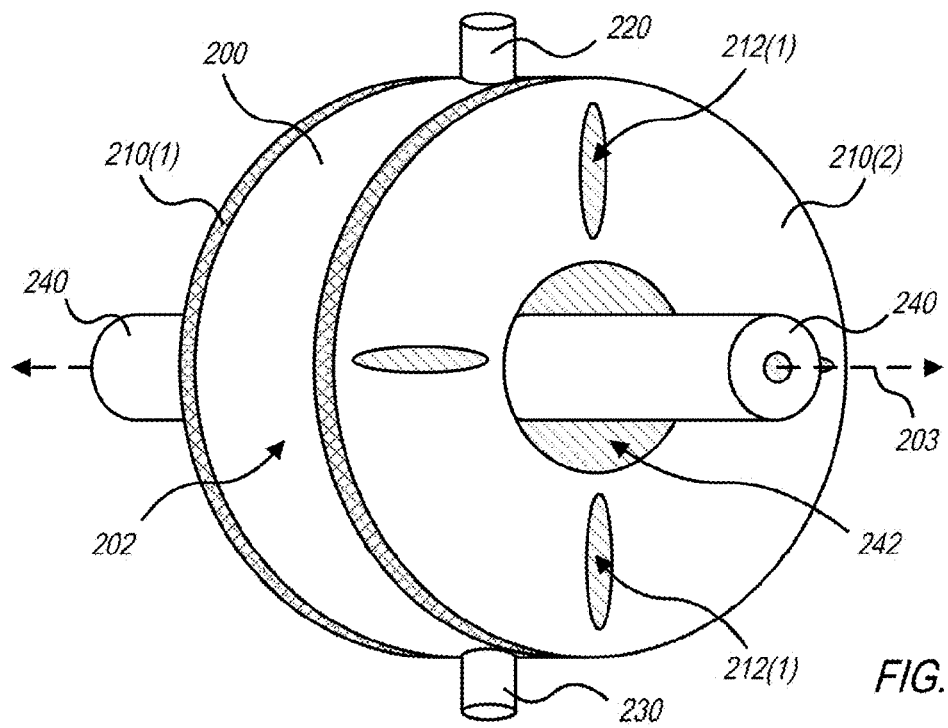
Figure 2C:
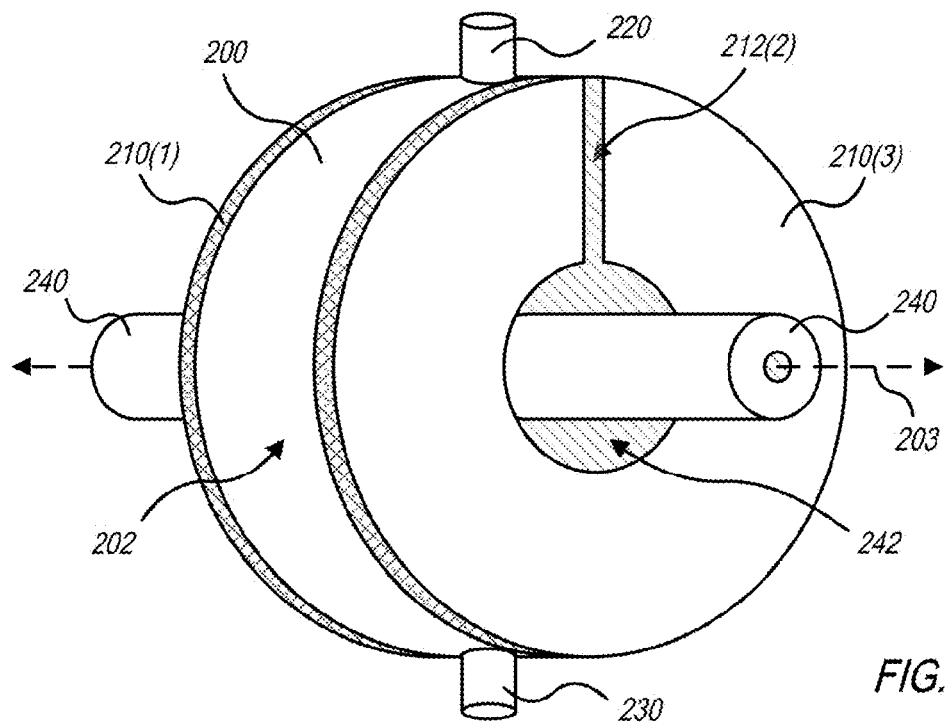

FIGS. 2A, 2B and 2C schematically illustrate components of RPS 130, FIG. 1, according to an embodiment. FIG. 2A is a side elevational view of certain components, while FIGS. 2B and 2C are angled elevational views of only some of the components shown in FIG. 2A, with slight variations. It is understood that RPS 130 may have many other components than those shown; the items shown in FIGS. 2A, 2B and 2C are selected for clarity of illustration.

RPS 130 is an inductively coupled plasma generator. RPS 130 includes a plasma vessel 200 that receives input gas in an input connection 220 and provides plasma products at an output connection 230. Plasma vessel 200 encloses a cavity 202 of a toroidal shape that defines an axis 203 therethrough. Input connection 220 and output connection 230 are in fluid communication with cavity 202. It is understood that the locations of input connection 220 and output connection 230 are arbitrary and may vary among embodiments. Plasma vessel 200 may be made of a dielectric material, for example aluminum nitride, that has desirable properties such as high thermal conductivity, an ability to withstand high temperature, and compatibility with the desired input gases and their resulting plasma products. Those skilled in the art will note that dielectric materials are generally not used for plasma vessels of inductively coupled plasma systems due to thermal constraints. In embodiments, the present disclosure overcomes these constraints by use of appropriate materials (e.g., aluminum nitride), maximizing power coupling into the plasma itself (thus minimizing waste heat generation) and efficient cooling.

Input energy to RPS 130 is provided by application of an oscillating electrical current at RF inputs 260(1) and 260(2) that connect with induction coils 250(1) and 250(2) respectively. Coils 250(1) and 250(2) wrap around a magnetic (e.g., ferrite) core 240 that passes through plasma vessel 200, as shown. Axis R in FIG. 2A and in other drawings denotes a radial direction relative to axis 203, about which plasma vessel 200 is symmetric except for input and output connections 220, 230. FIGS. 3A-3D and 4A-4B provide further schematic illustration of the directions and effects of magnetic fields generated by coils such as 250(1), 250(2).

Plasma vessel 200 is flanked by one or more cooling plates, for example cooling plates 210(1), 210(2) and/or 210(3) that have high thermal conductivity. In embodiments, cooling plates 210 may be made of copper or alloys thereof. A gap 242 between magnetic core 240 and cooling plates 210, and/or optional apertures 212 within cooling plates 210, advantageously allow magnetic fields induced by induction coils 250 into the vicinity of plasma vessel 200, as discussed below. Geometries of apertures 212 that are depicted in FIG. 2B are representative only, and only two such apertures are depicted, for clarity of illustration.

Apertures 212 may be advantageously provided in cooling plates 210 as shown in FIGS. 2B and 2C. Apertures 212 advantageously allow the magnetic fields generated by coils 250 to extend into plasma vessel 200, and may help to disrupt parasitic electrical currents within cooling plates 210 such that more of the total energy radiated by induction coils 250 couples to plasma within plasma vessel 200. Apertures 212 that are radial slots are especially advantageous in terms of disrupting such parasitic electrical currents. FIG. 2B illustrates an embodiment with cooling plate 210(2) that defines apertures 212(1) as elliptical shapes with edges that are within an outer circumference of cooling plate 210(2). FIG. 2C illustrates an embodiment with cooling plate 210(3) that defines a single aperture 212(2) as a radial slot with edges that intersect outer and inner edges of an outer circumference of cooling plate 210(2). Providing at least one slot such as aperture 212(2) that completely interrupts azimuthal current paths about toroidal axis 203 is advantageous in terms of coupling RF energy from induction coils 250 (FIG. 2A) into plasma vessel 200. The illustration of single aperture 212(2) is exemplary only; in embodiments, more than one aperture 212(2) may be provided, and/or apertures similar to aperture 212(1) and aperture 212(2) may both be present.

Power dissipated as heat within RPS 130 is removed by a cooling system, for example a liquid cooling system. In particular, cooling plates 210(1) and 210(2) are in thermal contact with respective sides of plasma vessel 200 and may contain tubes or channels within which a cooling fluid flows.

The cooling fluid is typically a liquid. In embodiments, one or more cooling fluids may flow serially or in parallel through any or all of induction coils 250, magnetic core 240 and/or other components of RPS 130. In addition to cooling plates 210(1) and 210(2), additional cooling features may be provided, for example about the front, rear, top or bottom of plasma vessel 200. When the additional cooling features are formed of metal or other material that impedes or otherwise affects magnetic fields, design and placement of such features is done with consideration for their effect on magnetic fields around and in plasma vessel 200, as now described.

FIGS. 3A-3D schematically illustrate exemplary magnetic field configurations that are achievable with certain combinations of magnetic core elements and windings carrying electrical currents, according to embodiments. In FIGS. 3A-3D, 4 and 5, directions of current and magnetic fields are shown with ∧ >∨ < symbols.

Figure 3A:
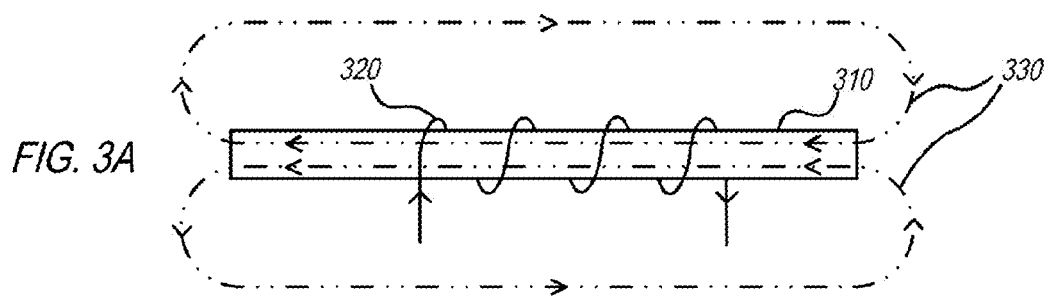
FIGS. 3A-3D schematically illustrate exemplary magnetic field configurations that are achievable with certain combinations of magnetic core elements and windings carrying electrical currents, according to embodiments.

FIG. 3A shows a simple, straight magnetic core (e.g., ferrite) element 310 and an induction coil 320 that wraps about element 310. When current passes through induction coil 320 in the direction noted, a magnetic field 330 develops and is shaped by the presence of element 310. Because all magnetic fields form closed loops, when magnetic field 330 reaches ends of element 310 it extends out into a space surrounding element 310 to complete each loop, as shown. Those skilled in the art will understand that magnetic field 330 also extends into and out of the plane of the drawing, radially symmetric about element 310. It is also understood that induction coil 320 could be broken into two or more induction coil segments wrapped about element 310 and connected in series, as long as all of the segments wrap in the same direction about element 310.

Figure 3B:
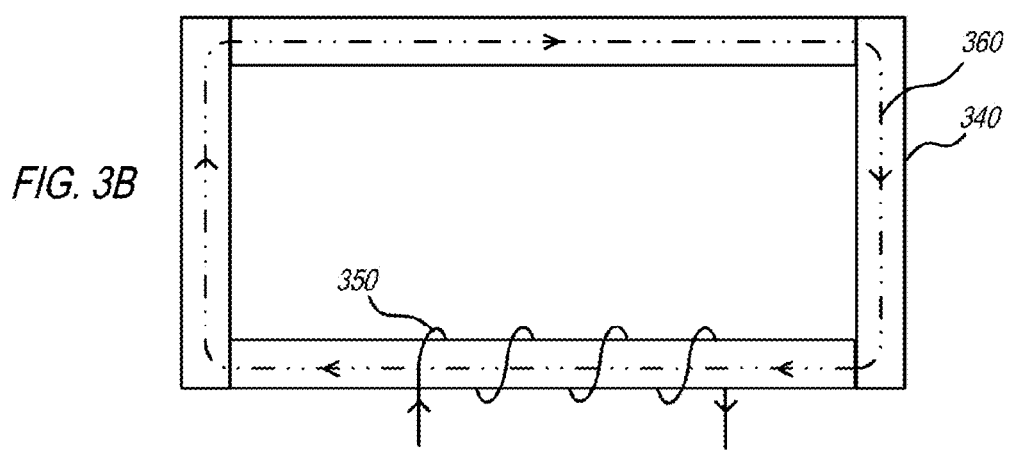

In FIG. 3B, a magnetic core element 340 forms a closed shape such that a magnetic field 360 generated by an induction coil 350 loops through element 340 without extending into space around element 340. The configuration shown in FIG. 3B is utilized in certain plasma generators wherein a plasma chamber (not shown) lies within element 340 such that magnetic field 360 induces an electrical current within the plasma chamber.

Figure 3C:
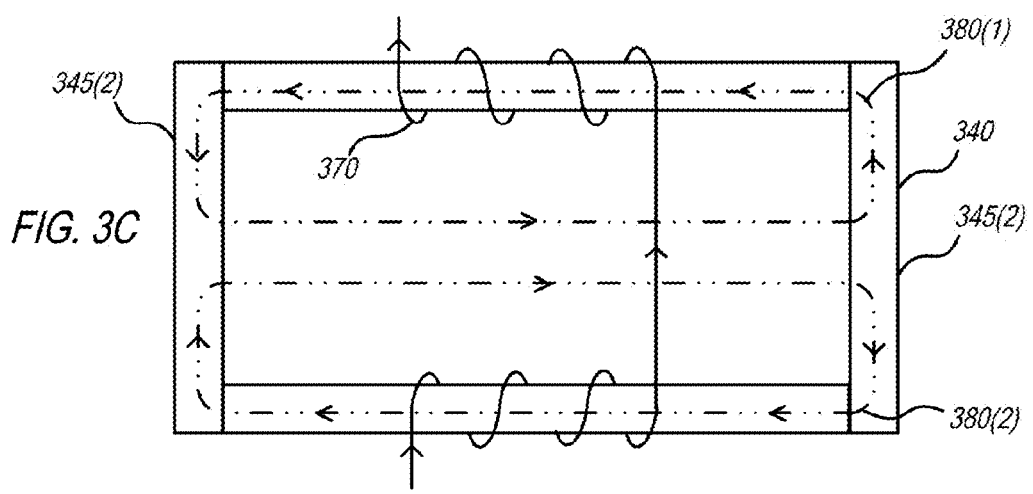

In FIG. 3C, an induction coil 370 wraps around magnetic core element 340 differently than coil 350; in particular, induction coil 360 wraps around opposing sides of element 340 so as to generate magnetic fields 380(1), 380(2) that oppose one another within side elements 345(1), 345(2) of the closed shape formed by element 340. In this configuration, magnetic fields 380(1), 380(2) are forced to exit elements 345(1), 345(2) to complete their respective loops.

Figure 3D:
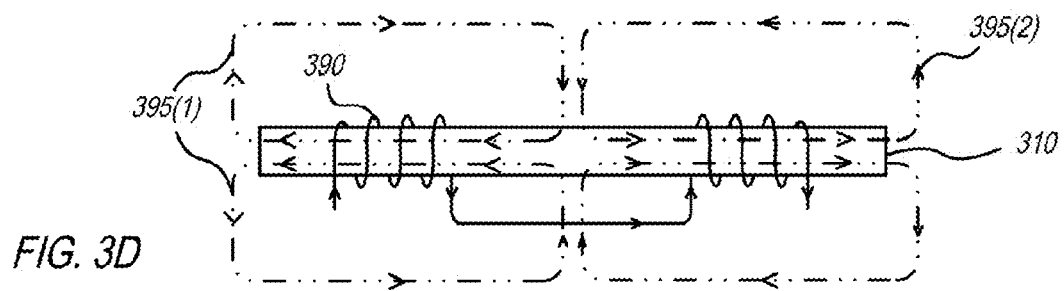

In FIG. 3D, straight magnetic element 310 (as in FIG. 3A) has an induction coil 390 wrapped around it such that a winding direction of coil 390 changes from one side of magnetic element 310 to the other. Thus, when current passes through induction coil 390 as indicated, opposing magnetic fields 395(1) and 395(2) develop. In this configuration, similar to the case shown in FIG. 3C, magnetic fields 395(1), 395(2) are forced to exit elements 310 to complete their respective loops. Those skilled in the art will understand that magnetic fields 395(1), 395(2) also extend into and out of the plane of the drawing, radially symmetric about element 310.

FIG. 4 is a cross-sectional, schematic illustration of a magnetic configuration of an RPS 400 that may be understood according to the principles explored in FIGS. 3A-3D, according to an embodiment. It is understood that RPS 400 may have many other components than those shown; the components shown in FIG. 4 are selected for clarity of illustration. A dashed line 6-6' indicates a section that corresponds to magnetic field modeling data shown in FIG. 6.

RPS 400 includes a toroidal plasma vessel 405 flanked by cooling plates 410(1) and 410(2). A magnetic (e.g., ferrite) core 440 extends through the center of plasma vessel 405, as shown. Induction coils 450(1) and 450(2) are connected as shown, and wrap about ends of magnetic core 440. In operation, an RF source (not shown) drives induction coils 450(1) and 450(2) (or, alternatively, coils 450(1) and 450(2) may not be connected as shown, but may be driven in parallel such that they are driven in phase with one another). Accordingly, induction coils 450(1), 450(2) and magnetic core 440 set up a magnetic field 460, as shown. Magnetic field 460 does not pass through cooling plates 410, and thus extends beyond cooling plates 410 and plasma vessel 405, as shown. Those skilled in the art will understand that magnetic field 460 also extends into and out of the plane of the drawing, radially symmetric about magnetic core 440. Although stray fields may exist within plasma vessel 405, overall magnetic field density is low within plasma vessel 405 due to the arrangement of magnetic core 440 through plasma vessel 405, and cooling plates 410 flanking plasma vessel 405 in the axial direction.

FIG. 5 is a cross-sectional, schematic illustration of a magnetic configuration of an RPS 500 that may also be understood according to the principles explored in FIGS. 3A-3D, according to an embodiment. It is understood that RPS 500 may have many other components than those shown; the components shown in FIG. 5 are selected for clarity of illustration. A dashed line 7-7' indicates a section that corresponds to magnetic field modeling data shown in FIG. 7.

RPS 500 includes a toroidal plasma vessel 505 flanked by cooling plates 510(1) and 510(2). A magnetic (e.g., ferrite) core 540 extends through the center of plasma vessel 505, as shown. Induction coils 550(1) and 550(2) are connected as shown, and wrap about ends of magnetic core 540. Note that induction coils 550(1) and 550(2) are connected differently as compared with induction coils 450(1) and 450(2), FIG. 4; the arrangement shown in FIG. 5 provides a very different result from that shown in FIG. 4. In operation, an RF source (not shown) drives induction coils 550(1) and 550(2). Accordingly, induction coils 550(1), 550(2) and magnetic core 540 set up magnetic fields 560(1) and 560(2), as shown. Magnetic fields 560(1) and 560(2) do not pass through cooling plates 510, but can pass through plasma vessel 505. Thus, magnetic fields 560(1) and 560(2) set up similar to magnetic fields 395(1) and 395(2), FIG. 3D. Those skilled in the art will understand that magnetic fields 560(1) and 560(2) also extend into and out of the plane of the drawing, radially symmetric about magnetic core 540.

The arrangement shown in FIG. 5 provides a significant radial magnetic field in plasma vessel 505, and thus provides significantly better RF power coupling into plasma vessel 505 than the arrangement shown in FIG. 4 provides for plasma vessel 405. As understood by those skilled in the art, higher RF power coupling is desirable because it increases plasma products produced per power input. This effect can be utilized to improve throughput of a processing tool that receives the plasma products, to reduce the power that must be supplied in order to generate the same plasma products, and/or to reduce the overall size and power consumption of RPS 500 for a given amount of plasma products needed for processing. Yet, it may be considered counterintuitive to provide opposing magnetic fields within a single magnetic core, as shown in FIGS. 3D and 5, because magnetic cores are usually used to confine and direct a magnetic field in a single direction.

In RPS 500, even though multiple axial magnetic field directions are implemented, use of a single magnetic core 540 may be advantageous, as compared to use of multiple magnetic core pieces, for a variety of reasons. Multiple magnetic core pieces would have to be aligned precisely and mechanically stabilized, because opposing fields 560(1), 560(2) would generate repulsive forces on mechanically separate pieces of magnetic material. Less than perfect alignment or mechanical instability, due to multiple magnetic core pieces, may degrade uniformity of plasma generation within plasma vessel 505. Non-uniform plasma generation may, in turn, lead to undesirable effects such as reduced generation of plasma products and/or non-uniform spatial distribution of the plasma products as they are directed from an RPS system to a processing location (see, e.g., FIG. 1). Also, a single magnetic core 540 allows easy fabrication of a center channel to pass coolant through, but separate magnetic core pieces with cooling channels would be much more difficult to fabricate and might not result in uniform cooling (e.g., for separate magnetic core pieces, a channel would have to double back within each of the pieces, possibly leading to asymmetry and potential for uneven cooling).

Figure 6:
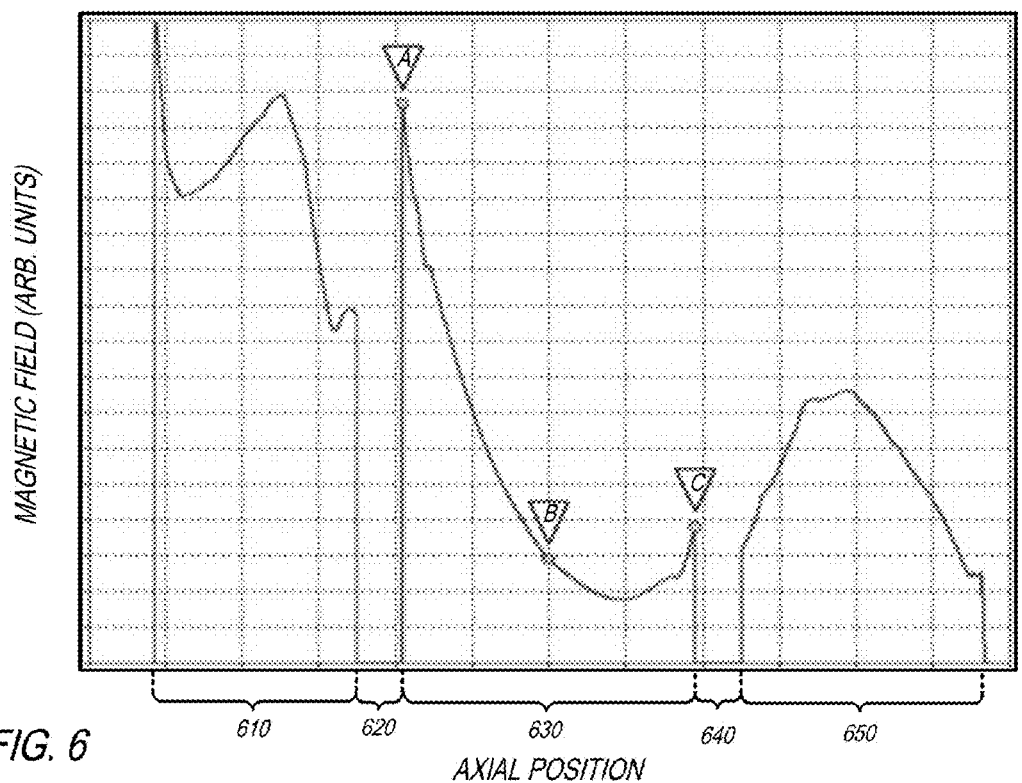
FIG. 6 shows magnetic field modeling data corresponding to line 6-6', FIG. 4.

FIG. 6 shows magnetic field modeling data corresponding to line 6-6', FIG. 4. Modeled magnetic field, in arbitrary units, is on the vertical axis while spatial position in the axial direction is on the horizontal axis. First and last regions 610 and 650 correspond to leftmost and rightmost portions of line 6-6' respectively, that is, portions that are outside plasma vessel 405 and both cooling plates 410(1), 410(2). Regions 620 and 640 correspond to cooling plates 410(1) and 410(2) respectively (e.g., where the magnetic field does not penetrate). Central region 630 corresponds to plasma vessel 405. As FIG. 6 shows, the magnetic field within region 630 is high at the edges (points A and C) but nonuniform, and dips to a low value at its center (point B). Thus, the highest region of the magnetic field is roughly at the walls of plasma vessel 405, while the center of plasma vessel 405 sees a low magnetic field. In inductively coupled plasmas, asymmetry in magnetic field distribution can disadvantageously lead to unbalanced plasma ionization distribution, and subsequent nonuniformity in plasma product generation and transportation towards a downstream processing location.

Figure 7:
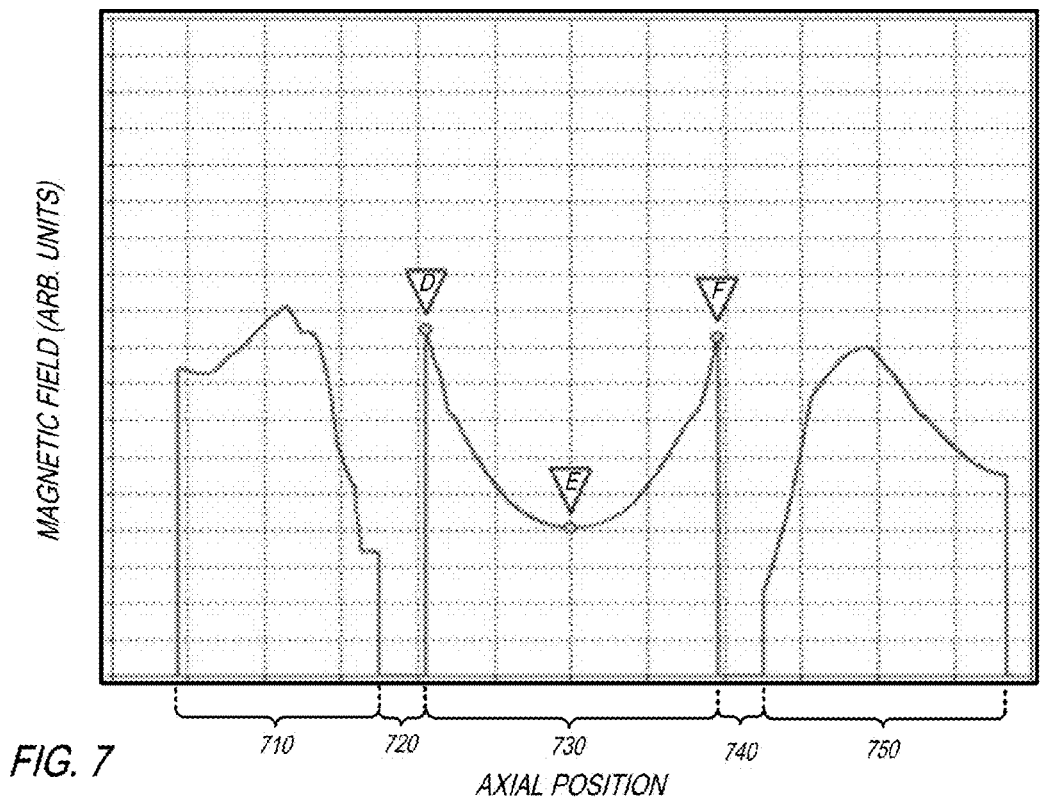
FIG. 7 shows magnetic field modeling data corresponding to line 7-7', FIG. 5.

FIG. 7 shows magnetic field modeling data corresponding to line 7-7', FIG. 5. Modeled magnetic field, in arbitrary units, is on the vertical axis while spatial position in the axial direction is on the horizontal axis. First and last regions 710 and 750 correspond to leftmost and rightmost portions of line 7-7' respectively, that is, portions that are outside plasma vessel 505 and both cooling plates 510(1), 510(2). Regions 720 and 740 correspond to cooling plates 510(1) and 510(2) respectively (e.g., where the magnetic field does not penetrate). Central region 730 corresponds to plasma vessel 505. As FIG. 7 shows, the magnetic field within plasma vessel 505 is again relatively high at the edges (points D and F) but much more uniform than the distribution shown in FIG. 6. The dip at its center (point E) is also less pronounced. The field at each point in central regions 630 and 730 respectively of FIGS. 6 and 7 is the sum of contributions from each of the outer regions, so the central region 730 magnetic distributions can be further modified by decreasing the distance between the cooling plates and induction coils. In this manner, it is believed that a central region magnetic distribution can be achieved that is essentially flat, or even higher in the center than at the edges. This is expected to increase production of plasma products in turn, leading to the beneficial results discussed above, and others. For example, magnetic field distribution that is higher in the center than at the edges may enhance ionization near the center region, resulting in a higher radical density toward the center for direct diffusion toward the outside of the plasma vessel. Conversely, a magnetic field distribution that is higher in the edges than at the center may result in radical diffusion toward the center region.

Figure 8:
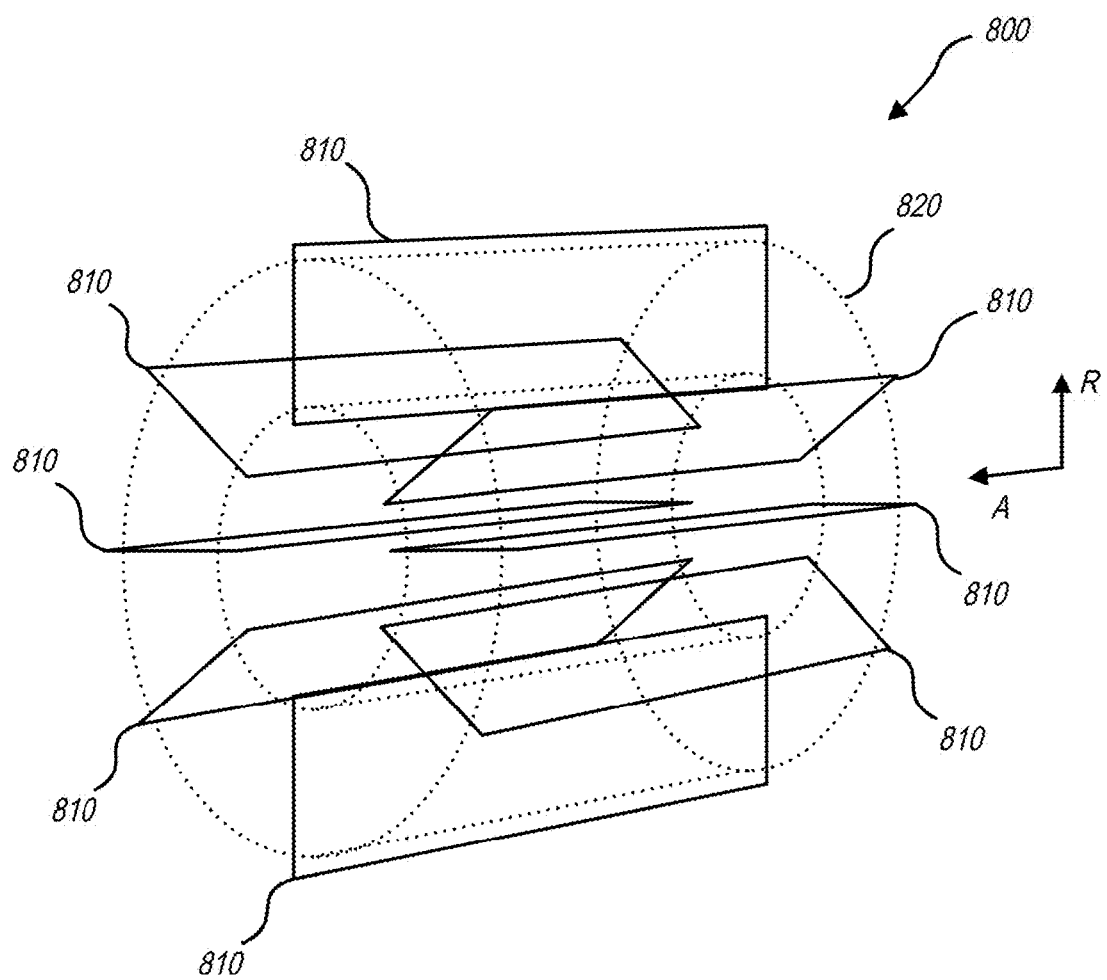
FIG. 8 schematically shows components of a Faraday shield assembly disposed adjacent to a toroidal plasma vessel, according to an embodiment.

FIG. 8 schematically shows components of a Faraday shield assembly 800 disposed adjacent to a toroidal plasma vessel 820, according to an embodiment. Toroidal plasma vessel 820 is shown in ghost outline only, for clarity of illustration. An axial direction denoted by A is shown, as is a representative radial direction denoted by R, but it is understood that the radial direction is perpendicular in all directions about a toroidal axis of plasma vessel 820.

Components 810 of Faraday shield 800 encircle the toroidal shape of plasma vessel 820 in the radial and axial directions to lower electric field differentials in those directions, to reduce capacitive plasma coupling and ion strike energy at corresponding inner walls of plasma vessel 820. In embodiments, Faraday shield 800 does not include azimuthally oriented (e.g., in the direction of curvature of plasma vessel 820) components because such components may develop high parasitic currents in response to the magnetic field utilized to excite the plasma within plasma vessel 800. Faraday shield 800 advantageously covers a low fraction (e.g., less than 10% or less than 2%) of surface area of the cylindrical inner and outer surfaces of plasma vessel 820, in order to provide maximum magnetic field exposure to plasma vessel 820. In embodiments, components 810 are connected to ground or another fixed potential. Connections among components 810 and/or connecting components 810 to the fixed potential are advantageously made outside an inner cavity of plasma vessel 820 (e.g., where a magnetic core is disposed; see FIGS. 2A, 2B) to avoid such connections having an azimuthal orientation.

In embodiments, components 810 are for example metal wires, strips or rods; also, components 810 may be portions of cooling plates disposed adjacent to plasma vessel 820 (e.g., cooling plates 210, FIGS. 2A and 2B, cooling plates 410, FIG. 4 or cooling plates 510, FIG. 5). These types of components 810 may also be mixed, for example Faraday shield 800 may be implemented by connecting wires, strips or rods in the axial direction with cooling plates that form radial portions. Although varying types of metals, and varying shapes, can be utilized to form components 810, such components are advantageously arranged symmetrically about plasma vessel 820 to preserve symmetric and uniform plasma product generation, as discussed above.

While the principles of the present disclosure have been described above in connection with specific apparatuses and methods, it is to be clearly understood that this description is made only by way of example and not as limitation on the scope of the disclosure.

What is claimed is:
1. A plasma source, comprising:
  a plasma vessel comprising a dielectric material that encloses a cavity of a toroidal shape, the toroidal shape defining a toroidal axis therethrough,
    the plasma vessel forming input and output connections, each of the input and output connections being in fluid communication with the cavity;
  one or more metal plates disposed adjacent to the plasma vessel for cooling the plasma vessel;
  a magnetic core disposed along the toroidal axis such that respective first and second ends of the magnetic core extend beyond axially opposed sides of the plasma vessel; and
  first and second induction coils wound about the respective first and second ends of the magnetic core;

wherein a plasma is generated within the toroidal cavity when an input gas is supplied through the input connection and an oscillating electrical current is supplied to the first and second induction coils.

2. The plasma source of claim 1, wherein the first and second induction coils provide currents in opposing current directions about the respective first and second ends of the magnetic core, such that magnetic fields induced by the first and second induction coils in the magnetic core are in opposite directions along the toroidal axis.

3. The plasma source of claim 1 wherein:
the one or more metal plates comprise two metal plates disposed adjacent to axially opposed sides of the plasma vessel such that the plasma vessel is between the metal plates,
the magnetic core passes through respective apertures in each of the metal plates, and
the first and second ends of the magnetic core are outside the metal plates.

4. The plasma source of claim 3 wherein the magnetic core extends through an aperture defined by each of the metal plates, such that a gap is present between each of the metal plates and the magnetic core, the gap providing a path for at least a portion of magnetic fields generated by the first and second induction coils to propagate into the plasma vessel.

5. The plasma source of claim 1 wherein the plasma vessel comprises aluminum nitride.

6. The plasma source of claim 1 wherein the one or more metal plates comprise copper.

7. The plasma source of claim 1 wherein the one or more metal plates form channels therein for a cooling fluid.

8. The plasma source of claim 7 wherein the cooling fluid passes through each of the one or more metal plates, the first and second induction coils and the magnetic core.

9. The plasma source of claim 8 wherein the magnetic core consists of a single piece of magnetic material that defines a channel for the cooling fluid.

10. The plasma source of claim 1, further comprising a Faraday shield having components that encircle the plasma vessel in radial and axial directions.

11. A method of generating a plasma, comprising:
supplying an input gas to an input connection of a plasma vessel,
the plasma vessel comprising a dielectric material that encloses a cavity of a toroidal shape, the toroidal shape defining a toroidal axis therethrough,
a magnetic core disposed along the toroidal axis, and the input connection being in fluid communication with the cavity;
supplying an oscillating electrical current to first and second induction coils that are wound about the magnetic core, such that respective first and second ends of the magnetic core extend beyond axially opposed sides of the plasma vessel, and the oscillating electrical current ignites the plasma within the input gas; and
cooling the plasma vessel by utilizing one or more metal plates disposed adjacent to the plasma vessel.

12. The method of generating a plasma of claim 11, wherein supplying the oscillating electrical current to the first and second induction coils comprises:
supplying the oscillating electrical current to the first induction coil in a first current direction about the magnetic core, and
supplying the oscillating electrical current to the second induction coil in a second current direction about the magnetic core,
the first and second current directions being opposite to one another such that the first and second induction coils generate magnetic fields in opposite directions within the magnetic core.

13. The method of generating a plasma of claim 11, wherein cooling the plasma vessel comprises passing a cooling fluid through the one or more metal plates.

14. The method of generating a plasma of claim 13, wherein cooling the plasma vessel further comprises passing the cooling fluid through the first and second induction coils and the magnetic core.

15. A plasma source, comprising:
a plasma vessel comprising a dielectric material that encloses a cavity of a toroidal shape, the toroidal shape defining a toroidal axis therethrough, the plasma vessel forming input and output connections, each of the input and output connections being in fluid communication with the cavity;
two metal plates disposed adjacent to axially opposed sides of the plasma vessel such that the plasma vessel is between the metal plates, the two metal plates forming channels therein for a cooling fluid, for cooling the plasma vessel;
a magnetic core, comprising a single piece of magnetic material with a channel therein for the cooling fluid, disposed along the toroidal axis such that respective first and second ends of the magnetic core extend beyond axially opposed sides of the plasma vessel;
first and second induction coils that provide currents in opposing directions about the respective first and second ends of the magnetic core, such that magnetic fields induced in the magnetic core by the currents are in opposite directions along the toroidal axis; and
a Faraday shield comprising components that encircle the plasma vessel in an axial direction, the components being electrically connected with the two metal plates;
wherein a plasma is generated in the cavity when an input gas is supplied through the input connection and the currents are supplied to the first and second induction coils.

* * * * *